US008829332B1

(12) United States Patent
Roizin et al.

(10) Patent No.: US 8,829,332 B1
(45) Date of Patent: Sep. 9, 2014

(54) PHOTOVOLTAIC DEVICE FORMED ON POROUS SILICON ISOLATION

(71) Applicants: Tower Semiconductor Ltd., Migdal Haemek (IL); Yissum Research Development Company of The Hebrew University of Jerusalem Ltd., Jerusalem (IL)

(72) Inventors: Yakov Roizin, Afula (IL); Evgeny Pikhay, Haifa (IL); Irit Chen-Zamero, Haifa (IL); Ora Eli, Afula (IL); Micha Asscher, Jerusalem (IL); Amir Saar, Jerusalem (IL)

(73) Assignees: Tower Semiconductor Ltd., Migdal Haemek (IL); Yissum Research Development Company of the Hebrew University of Jerusalem Ltd., Givat Ram, Jerusalem (IL)

( * ) Notice: Subject to any disclaimer, the term of this patent is extended or adjusted under 35 U.S.C. 154(b) by 0 days.

(21) Appl. No.: 13/831,413

(22) Filed: Mar. 14, 2013

(51) Int. Cl.
*H01L 31/042* (2014.01)
*H01L 31/0352* (2006.01)
*H01L 27/142* (2014.01)
*H01L 31/062* (2012.01)

(52) U.S. Cl.
CPC .......... *H01L 27/142* (2013.01); *H01L 31/0352* (2013.01)
USPC .......................................... 136/249; 257/290

(58) Field of Classification Search
CPC ... H01L 31/042; H01L 31/061; H01L 31/075; H01L 31/076; H01L 31/078; H01L 31/02008; Y02E 10/546; Y02E 10/547
USPC ........... 257/290, E27.135, E31.039; 136/246, 136/249, 255
See application file for complete search history.

(56) References Cited

U.S. PATENT DOCUMENTS

| | | | |
|---|---|---|---|
| 4,341,918 A | 7/1982 | Evans, Jr. et al. | |
| 4,810,667 A | 3/1989 | Zorinsky et al. | |
| 5,376,560 A | 12/1994 | Aronowitz et al. | |
| 6,281,428 B1 | 8/2001 | Chiu et al. | |
| 6,627,507 B2 | 9/2003 | Yuan | |
| 8,344,440 B2 | 1/2013 | Pikhay et al. | |
| 2003/0160251 A1* | 8/2003 | Wanlass et al. | 257/80 |
| 2012/0292675 A1* | 11/2012 | Roizin et al. | 257/290 |
| 2013/0298963 A1* | 11/2013 | Greiff et al. | 136/246 |

OTHER PUBLICATIONS

Otto, Martin et al. "Extremely low surface recombination velocities in black silicon passivated by atomic layer deposition", Applied Physics Letters, 100, 191603 (2012), 4 pages.

* cited by examiner

*Primary Examiner* — Armando Rodriguez
*Assistant Examiner* — Mohammed R Alam
(74) *Attorney, Agent, or Firm* — Bever, Hoffman & Harms, LLP; Patrick T. Bever

(57) ABSTRACT

A photovoltaic device includes lateral P-I-N light-sensitive diodes disposed on a silicon island formed by a P– epitaxial layer and surrounded by trenches that provide lateral isolation, where the island is separated from the substrate by a porous silicon region that is grown under the island and isolates the lower portions of the photovoltaic device from the highly doped substrate. The trenches extend through the P– epitaxial material into the P+ substrate to facilitate self-limiting porous silicon formation at the bottom of the island, and also to suppress electron-hole recombination. A protective layer (e.g., SiN) is formed on the trench walls to further restrict porous silicon formation to the bottom of the island. Black silicon on the trench walls enhances light capture. The photovoltaic devices form low-cost embedded photovoltaic arrays on CMOS IC devices, or are separated to produce low-cost, HV solar arrays for solar energy sources, e.g. for solar concentrators.

19 Claims, 13 Drawing Sheets

PHOTOVOLTAIC DEVICE FORMED ON POROUS SILICON ISOLATION

FIELD OF THE INVENTION

This invention relates to photovoltaic devices, and particularly to photovoltaic devices including P-I-N light sensitive diodes.

BACKGROUND OF THE INVENTION

High voltage low-power photovoltaic sources have a variety of applications including solar chargers, wireless sensors and detectors, different portable consumer products, self-powered light detectors, energy sources for driving MEMS engines, etc. Many of the state of the art integrated circuits (ICs) are capable of operating at milliwatt-microwatt power consumption levels that can be obtained from photovoltaic cells fabricated on the same silicon chip as the IC. Such photovoltaic HV sources can also be used for continuous charging of batteries in power management systems to prevent total discharge and enabling energy savings. If the output of the photoelectric source is high enough, it can be connected to a battery or energy storage capacitor (supercapacitor) to allow higher current peak values. The resulting energy harvesting system strongly increases the application field covering long-range RFID systems, smart dust products, etc.

There are two conventional approaches in integrating photovoltaic sources into the silicon IC.

The first conventional approach is to use conventional low-voltage (single p-n junction) photovoltaic elements and dc-dc boost converters capable of increasing the low-level input voltages to the levels of the IC system voltage (Vdd). This approach is utilized, for example, in products such as LTC 3108 produced by Linear Technology Corporation of Milpitas, Calif., USA. This approach requires a complicated analog circuit, and faces many challenges related to the need to process very low signals and distinguish them from stray voltages.

The second conventional approach is to connect the individual solar cells (p-n junction) in series on silicon (not the external connection of silicon dice). Some companies (e.g., Clare, an IXYS Company, of Beverly, Mass., USA) fabricate specialized chips that generate voltages up to several volts by connecting individual solar cells on the chip (e.g., Clare's CPC1822-CPC1832 products).

In most cases, in order to obtain high voltages, solar cells are fabricated at the isolated areas of silicon and then connected in series or series-and-parallel combinations.

A standard photovoltaic p-n diode cell typically generates from 0.4 to 0.7 V under illumination by the sunlight. The connection of photovoltaic elements can be, of course, external, if the solar cells are on separate silicon substrates (separate wafers). This is what can be found in most commercial solar energetics (photovoltaic) systems. It is clear that external connections strongly increase the system cost and decrease reliability. In case of working with light concentrators, the problem of connections becomes a bottleneck since the currents from individual solar wafers reach tens and hundreds of Amperes. HV cells solve the problem by decreasing the current for the same light power per unit square of the solar array surface.

Several solutions have been proposed to make HV solar cells on one silicon substrate.

A high voltage multi-junction solar cell is disclosed in U.S. Pat. No. 4,341,918 (Evans, et. al), where a plurality of discrete voltage generating regions or unit cells are formed in a single generally planar semiconductor body. The unit cells comprise doped regions of opposite conductivity type separated by a gap or undiffused region. Metal contacts connect adjacent cells together in series so that the output voltages of the individual cells are additive. A problem with this approach is that special metallization is needed by forming a pattern of parallel bars of aluminum paste that is screen-printed on the surface and fired to assure penetration of the aluminum through the diffused N+ region on this face and to make connection to P+ regions. Another problem is that the output voltage is limited since the common P-type base shunts the serially connected individual N+P (base) junctions.

Attempts to isolate the elements comprising the high-voltage where SOI isolation was employed are disclosed, for example, in U.S. Pat. No. 6,281,428 (Chiu et al). Chiu has demonstrated how to use the oxide layer of the SOI wafer as the isolating layer. The approach makes use of serially connected transverse photovoltaic cells formed by diffusions using special masks (six masks together with a special mask forming a mesa structure on the peripheral region to isolate the light-sensitive array). The photosensitive diodes are connected in series by metal plugs. Light enters the photosensitive array through dielectric layers.

The limitation of the approach taught by Chiu is the large number of additional masks specially added to the SOI core process in case of thin silicon on insulator layers. Also, for the mentioned thick Si substrates it is difficult to reach the bottom oxide-BOX (32) interface with the P+ diffusion, making the proposed P+-p device structure problematic.

What is needed is a photovoltaic device that addresses the problems listed above and can be produced using a standard process flow with minimal additional masks.

SUMMARY OF THE INVENTION

The present invention is directed to a photovoltaic device including lateral P-I-N light-sensitive diodes formed on one or more "islands" that are laterally bordered (isolated) by trenches and vertically bordered by a porous silicon (or oxidized porous silicon) layer that extends entirely under the island. Each light-sensitive diode includes P+ and N+ doped regions respectively formed by dopants extending into a relatively lightly doped (e.g., P−) upper epitaxial layer portion that is disposed on a relatively heavily doped (e.g., P+) silicon substrate, where the P+ and N+ doped regions are separated by an intervening intrinsic (undoped) region of the upper epitaxial layer portion. A benefit of the disclosed photovoltaic device is that the associated fabrication processes can be easily integrated into standard process flows (e.g., established CMOS, PM CMOS, or MEMS process flows) with only the addition of one mask used to form the trenches, whereby the photovoltaic device can be embedded into (i.e., formed on the same base substrate as) an integrated circuit device, wherein the photovoltaic device is electrically isolated from the base substrate by the trenches and porous silicon. According to an aspect of the invention, each island includes a base (lower) epitaxial portion having an intermediate (P+/−) doping level that is different from (e.g., lower than) the doping level of the P+ silicon substrate and higher than the P− doping level of the upper epitaxial portion. This intermediate doping level, which is generated at the interface between the P+ substrate and the P− epitaxial layer by up-diffusion of P-type dopant (e.g., boron) from the substrate into the lower portion of the epitaxial layer, facilitates the formation of porous silicon under the island (particularly in combination with a protective layer (e.g., SiN) formed on the island walls), and also serves to suppress electron-hole recombination (i.e., in a manner similar to that of most Si solar cells in which the back side of the wafer is doped P+ to deter electrons from approaching regions with recombination traps). By forming the light-sensitive diodes using existing (or only slightly modified) process flows, the present invention enables low-cost embedded photovoltaic arrays that can be integrally formed as part of a CMOS IC (electronic) device (e.g., PM, MEMS, RFID and other mixed signal/RFCMOS devices). Alternatively, the disclosed photovoltaic device can be separated by etching through the porous silicon to provide, for example, low-cost, high voltage solar arrays for solar energy concentrators.

According to an embodiment of the present invention, multiple parallel elongated islands are formed between associated isolating trenches, with multiple photo-sensitive diodes formed and connected in series along the elongated islands. In one embodiment, photo-sensitive diodes are disposed and connected in series along parallel elongated islands separated by elongated trenches, where the P+ and N+ doped regions forming adjacent diodes form lateral P/N junctions that are connected by N+/P+ tunnel junction with low resistance, salicide-butted contacts or conductive paste to decrease series resistance of N+/P+ junctions. These contacts are also easily formed using available or otherwise low-cost metallization processes (e.g., aluminum and/or silver and/or titanium films generated as part of standard CMOS processing), or any other conductive material forming low-resistance contacts with Si such as a titanium-nitride stack, gold, tungsten, or may be implemented by forming a P+-N+ low resistance tunnel diode. In another embodiment, photo-sensitive diodes are disposed on adjacent islands and connected in series by conductive structures extending over the intervening trench. The benefit of separating the series-connected diodes on separate islands is that this arrangement facilitates increased light conversion efficiency because light that enters the trenches has high chance to be absorbed by the vertical walls and not be reflected outside the HV solar array, which light absorption may be further enhanced by the addition of "black silicon" on the side walls of the trenches.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in photovoltaic devices produced substantially entirely using existing process flows. The following description is presented to enable one of ordinary skill in the art to make and use the invention as provided in the context of a particular application and its requirements. As used herein, directional terms such as "upper", "lower", "above", "below", "vertical" and "horizontal" are intended to provide relative positions for purposes of description, and are not intended to designate an absolute frame of reference. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
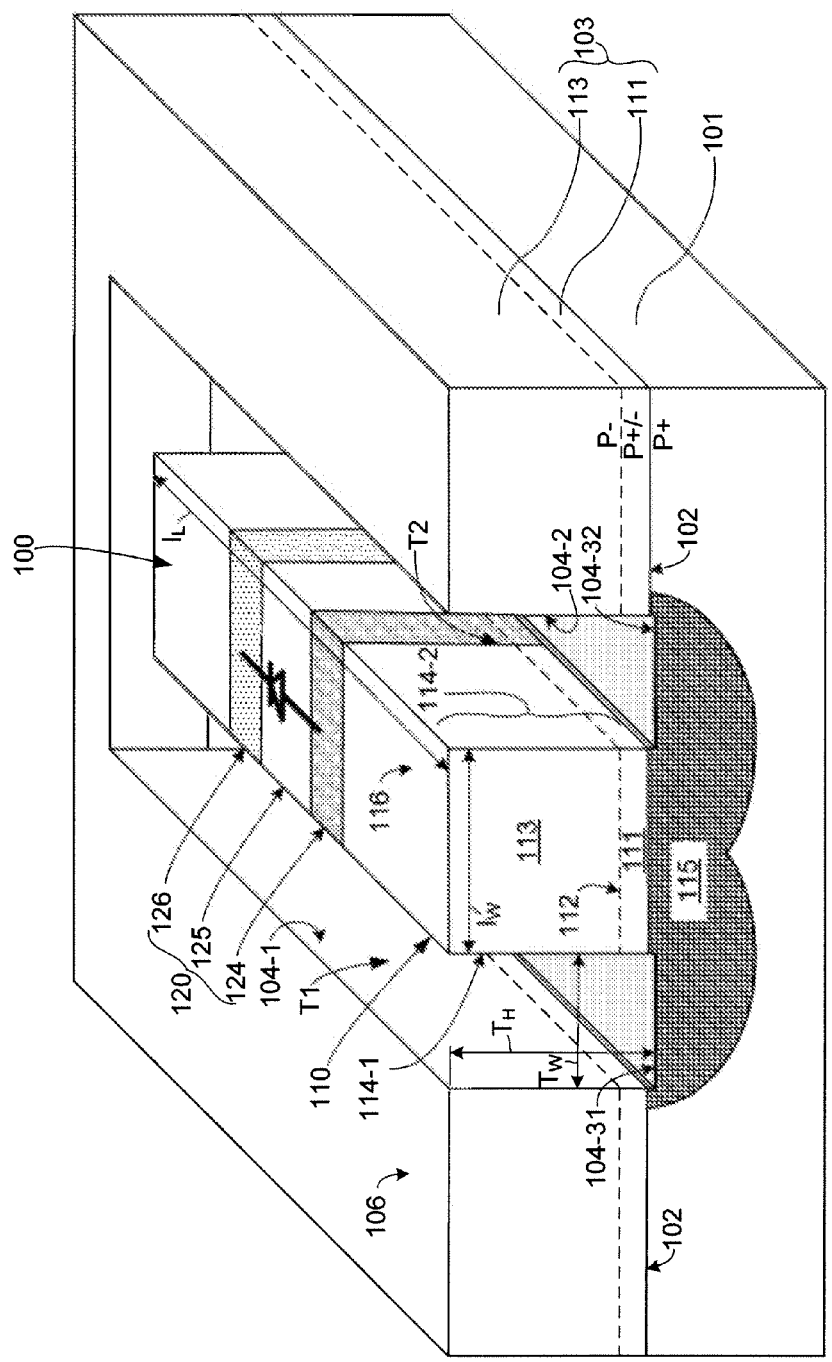
FIG. 1 is a top front perspective view showing a simplified photovoltaic device according to a generalized embodiment of the present invention.

FIG. 1 is perspective view showing a simplified photovoltaic device 100 according to a generalized embodiment of the present invention. Photo-voltaic device 100 is at least partially disposed on one or more silicon "islands" 110 that comprise portions of a P– epitaxial silicon layer 103, which is formed on a P+ (mono-crystalline or polycrystalline) silicon substrate 101 using known techniques. In particular, the epitaxial silicon material forming each island 110 includes a base epitaxial portion 111, which is disposed immediately above an interface (boundary) 102 between substrate 101 and epitaxial layer 103, and an upper epitaxial portion 113 disposed over base epitaxial portion 111. Base epitaxial portion 111 is characterized by having an intermediate "P+/–" (first) doping level that is higher than the lightly doped P– (second) doping level of upper epitaxial portion 113, and lower than the heavily doped P+ doping level of substrate 101. The intermediate P+/– doping level of base epitaxial portion 111 is generated by the up-diffusion of P-type dopant (e.g., Boron) from P+ substrate 101 (i.e., through interface barrier 102 between P+ substrate 101 and epitaxial layer 103). That is, P+/– base epitaxial portion 111 is an inherent portion of epitaxial layer 103 that results when P– epitaxial silicon is formed on a heavily doped P+ substrate. As used herein "P+/–" denotes an intermediate doping level (dopant concentration) that is between the lightly doped "P−" level of upper epitaxial portion 113 and the highly doped "P+" level of substrate 101.

The periphery of island 110 is defined by trench regions (trenches) T1 and T2, whereby island 110 is electrically isolated in a lateral direction from a remainder of substrate 101 by trenches T1 and T2, which are typically filled with a passivation material (not shown). As such, island 110 is defined by a width $I_W$ measured between a first vertical side wall 114-1 and a second vertical side wall 114-2, and an orthogonally oriented length $I_L$. Trenches T1 and T2, which are formed in the manner described below, respectively have widths $T_W$ extending between side walls 114-1 and 114-2 of island 110 and facing side walls 104-1 and 104-2 of adjacent portions of epitaxial layer 103, and have depths $T_D$ extending from upper surface 116 of upper epitaxial portion 113 to bottom surfaces 104-31 and 104-32. Note that the features depicted in FIG. 1 and the remaining drawings are not to scale in order to better illustrate the various device structures.

Referring to the top of island 110, photo-voltaic device 100 includes at least one lateral P-I-N photo-sensitive diode 120 formed by spaced-apart P+ and N+ doped regions 124 and 125. Although photo-voltaic device 100 typically includes multiple lateral light-sensitive P-I-N diodes, only one such diode 120 is shown in FIG. 1 for purposes of simplifying the following description. P+ doped region 124 is formed according to well established methods by a P+ dopant diffused into an associated portion of upper epitaxial portion 113, and N+ doped region 126 is formed by an N+ dopant diffused into another portion of upper epitaxial portion 113, with an intrinsic (undoped) region 125 of upper epitaxial portion 113 being disposed between P+ region 124 and N+ region 125. Lateral P-I-N photo-sensitive diode structures are known in the art, so a detailed explanation is omitted here. The important aspect of showing diode 120 in FIG. 1 is to indicate that it is substantially formed by doped regions 124 and 126 formed in P− upper epitaxial portion 113 on island 110.

According to an aspect of the present invention, base epitaxial portion 111 of island 110 is entirely disposed on a porous silicon region 115 that serves, for example, to electrically isolate island 110 from underlying structures (i.e., in the vertical direction), such as substrate 101. As indicated by the shaded region below island 110, porous silicon region 115 extends under the entire width $I_W$ and the entire length $I_L$ of island 110, and also extends into portions of substrate 101 disposed adjacent to trenches T1 and T2. As understood in the art, the phrase "porous silicon" refers to a form of silicon that including nanopores and mesopores (voids) having a width in the range of 2 to 10 nm and 10 to 100 nm respectively (typically, the size of the pores is in the range of 20-50 nm). The term "porosity" is generally used to define the amount of space occupied by pores (voids) in a porous silicon structure, which can range from 4% to 95%. As used herein, the phrases "porous silicon" (PS) and "oxidized porous silicon" (OPS) refer to regions of silicon material (i.e., monocrystalline silicon, amorphous silicon, polycrystalline silicon or silicon germanium) that are processed to include dispersed nanopores such that the silicon material exhibits an electrical resistance greater than $10^7$ Ohm. Note that OPS is formed by oxidizing PS (either chemically or electro-chemically or thermally or by any other means) to increase its electrical resistance. For brevity, the phrase "porous silicon" is used herein to refer to both PS and OPS.

According to another embodiment of the present invention, base epitaxial portion 111 has an intermediate (first) P-type doping concentration forming P+/−(first) doping level (e.g., producing conductivity in the range of 0.1-0.2 ohm-cm), upper epitaxial portion 113 and has a relatively low (second) P-type doping concentration forming a P− (second) doping level (e.g., producing conductivity in the range of 1-10 ohm-cm), and P+ substrate 101 has a relatively high (third) P-type doping concentration forming a P+ (third) doping level (e.g., producing conductivity in the range of 0.01-0.02 ohm-cm). The significance of the difference between these doping levels is that, as described in additional detail below, this difference causes the etching process used to form porous silicon region 115 to be self-limiting (i.e., stop) in the direction of P− epitaxial portion 113 when the etch front approaches the P−/P+ interface 112 between P+/− base epitaxial portion 111 and P− upper epitaxial portion 113, resulting in a high level of control over the thickness of porous silicon region 115 and good lateral uniformity. That is, porous silicon region 115 typically extends into portions of base epitaxial portion 111, but stops before it reaches lightly doped P− upper epitaxial region 113.

According to the embodiment depicted in FIG. 1, island 110 is formed by epitaxial material integrally disposed on a silicon substrate 101, and photo-voltaic device 100 comprises an "embedded" power source for an associated integrated circuit (IC, not shown) that is formed in other regions of silicon substrate 101. As used herein, the phrase "integrally disposed" and "embedded" are intended to mean that photo-voltaic device 100 and the associated IC are formed on a single continuous semiconductor substrate (e.g., a single "chip" or "die" cut from a monocrystalline wafer). As such, island 110 is formed by epitaxial material disposed on a portion of silicon substrate 101 that is isolated laterally from the IC by trenches T1 and T2, and is isolated vertically from the IC by porous silicon region 115. An exemplary process for generating this characteristic structure is described below with reference to FIGS. 2 and 3(A) to 3(I). According to an aspect of such "embedded" embodiments, base epitaxial portion 111 has the same intermediate (first) P+/− doping level as that of all lower regions of epitaxial layer 103 disposed adjacent to interface 102 with silicon substrate 101, and upper epitaxial portion 113 has the same (second) P− doping level as that of the remaining upper regions of epitaxial layer 103. That is, by utilizing a fabrication process such as that described below, island 110 comprises a section of epitaxial layer 103 that is electrically isolated from the remainder of epitaxial layer 103 and substrate 101 by the formation of trenches T1 and T2 and porous silicon region 115, but is otherwise electrically identical to the remainder of epitaxial layer 103.

Figure 2:
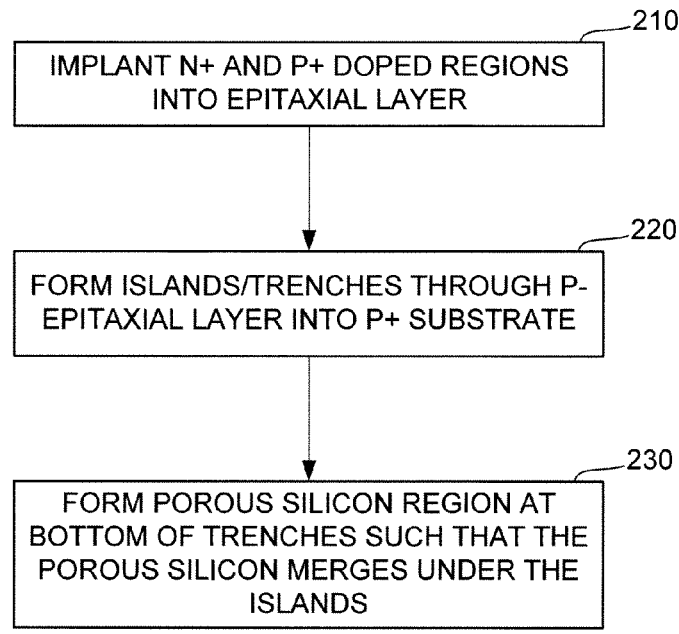
FIG. 2 is a flow diagram showing a generalized process flow associated with the photovoltaic device of FIG. 1 according to another embodiment of the present invention.

FIG. 2 is a flow diagram depicting a generalized method for producing photovoltaic devices on a silicon substrate (such as silicon substrate 101, described above) according to another embodiment of the present invention. Referring to the upper portion of FIG. 2, the generalized method begins by (block 210) forming P+ and N+ doped regions in the P− epitaxial layer, e.g., utilizing the standard P+ and N+ implants associated with a standard CMOS process flow. Next, (block 220) one or more islands are formed by etching elongated trenches through the epitaxial layer and into the underlying P+ silicon substrate. As described above, the resulting island includes the P+ and N+ doped regions disposed in a portion of the P− epitaxial layer, which in turn is disposed over a portion of the P+ silicon substrate. The generalized method then involves (block 230) forming a porous silicon region in the portion of P+ silicon substrate disposed under the elongated island such that the porous silicon region electrically isolates the elongated island from the underlying P+ silicon substrate. As described in detail below, the formation of porous silicon involves etching a region of the P+ substrate accessed through bottom surfaces of the trenches such that porous silicon grows and spreads laterally until adjacent porous silicon (PS) growths merge under the islands. A significant benefit of the generalized production method is that the associated fabrication processes needed to produce the various structures of photovoltaic device 100 can be easily integrated into standard process flows (e.g., established CMOS process flows, power management (PV) CMOS process flows, and microelectromechanical system (MEMS) process flows) with minimal modifications (i.e., the addition of a single "trench" mask, described below). That is, other than the formation of the "trench" mask, all of the associated fabrication processes described below are either implemented during or easily added to a conventional process flow. Other features and advantages of the generalized production method are described below with reference to FIGS. 3(A) to 3(I).

FIGS. 3(A) to 3(I) are perspective drawings illustrating the generalized production method of FIG. 2 in additional detail, and the related description provides further information regarding practical embodiments performed in accordance with specific embodiments of the present invention.

Figure 3A:
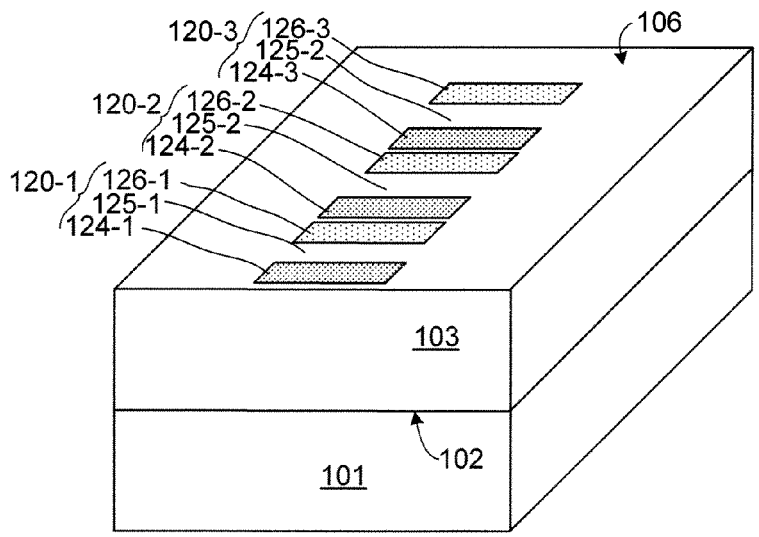
FIGS. 3(A), 3(B), 3(C), 3(D), 3(E), 3(F), 3(G), 3(H) and 3(I) are top front perspective views showing a simplified photovoltaic device during various stages of fabrication according to the process flow of FIG. 2.

Referring to FIG. 3(A), the production method begins with a P+ silicon substrate 101 having a silicon epitaxial layer 103 that is produced using known techniques. As described above, epitaxial layer 103 includes a P+/− base epitaxial portion 111 disposed immediately above an interface 102 with P+ substrate 101, and a P− upper epitaxial portion 113 disposed over base epitaxial portion 111. Note that in embedded applications, epitaxial layer 103 is utilized both for the formation of photovoltaic devices and the formation of other CMOS IC structures that are simultaneously fabricated on another portion of epitaxial layer 103. That is, patterned P+ doped regions 124-1, 124-2 and 124-3 and patterned N+ doped regions 126-1, 126-2 and 126-3, which are associated with three photo-sensitive diodes 120-1, 120-2 and 120-3, respectively, where each associated N+ and P+ doped region is separated by an associated intrinsic region 125-1, 125-2 and 125-3 formed by the P− material of epitaxial layer 103. For example, diode 120-1 includes P+ doped region 124-1, N+ doped region 126-1, and intrinsic region 125-1 that is disposed between P+ doped region 124-1 and N+ doped region 126-1. Similarly, diode 120-2 includes P+ doped region 124-2, N+ doped region 126-2, and intrinsic region 125-2, and diode 120-3 includes P+ doped region 124-3, N+ doped region 126-3, and intrinsic region 125-3. With this arrangement, the P+ and N+ doped regions are entirely separated (e.g., P+ doped region 124-1 is entirely separated from the N+ doped region 126-1 by intrinsic region 125-1), thereby forming the desired lateral P-I-N diode structure. Note that N+ doped region 126-1 of diode 120-1 and P+ doped region 124-2 of diode 120-2 are disposed in corresponding adjacent regions of epitaxial layer 103, and that N+ doped region 126-2 of diode 120-2 and P+ doped region 124-3 of diode 120-3 are disposed in corresponding adjacent regions of epitaxial layer 103. In a practical example, the geometry defined by the associated P+ and N+ implantation masks includes: N+ implant (5 μm), space (5 μm), P+ implant (5 μm), intrinsic (100μ). As set forth below, the adjacent doped regions are connected in a later part of the fabrication process utilized to complete the formation of diodes 120-1, 120-2 and 120-3. Note also that each doped region (e.g., P+ doped region 124-1 and N+ doped region 126-1 of diode 120-1) is elongated in the lateral (width) direction of the yet-to-be-formed island, and that each doped region is implanted to a depth (e.g., less than 100 nm) from upper surface 106 of epitaxial layer 103 so that they do not influence subsequent trench etch and PS formation procedures, described below). The drive-in of P+ and N+ implants are performed after the trench etch with a target to reach the surface of porous silicon. Fig. (C) shows the implants before the drive-in.

Figure 3B:
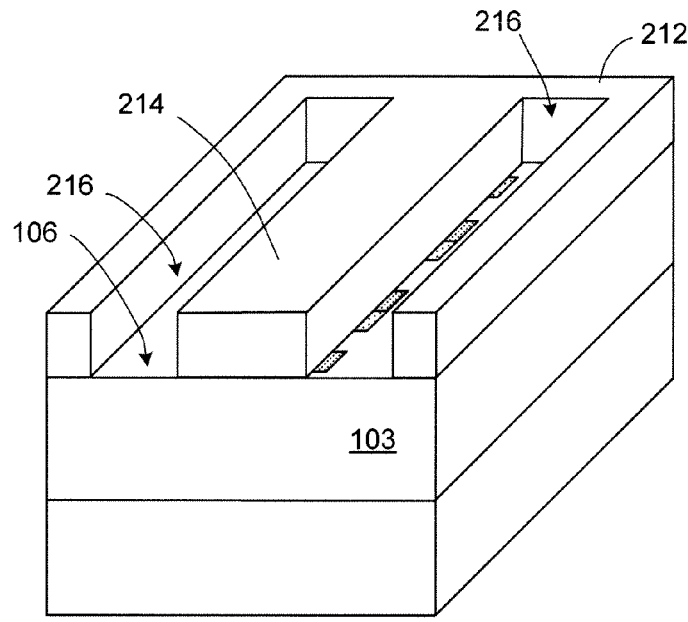

FIG. 3(B) shows a "trench" mask 212, which represents the single additional mask required to be added to a standard process flow (e.g., an established CMOS, PM CMOS, or MEMS process flow). Mask 212, which is formed using conventional methods and materials, is disposed on upper surface 106 and over thermal $SiO_2$/SiN layers (i.e., to decrease recombination for $SiO_2$ and protect the surface during etch back when cleaning the bottom of trenches after SiN deposition; the top protective layer of SiN is 0.1-0.3 μm; $SiO_2$ liner under is ~100-200 A). Mask 212 is patterned to include an elongated mask portion 214 disposed between parallel openings 216, where mask portion 214 extends over (masks) all of the previously formed P+ and N+ doped regions (i.e., extends in the length direction of the yet-to-be-formed island).

Figure 3C:
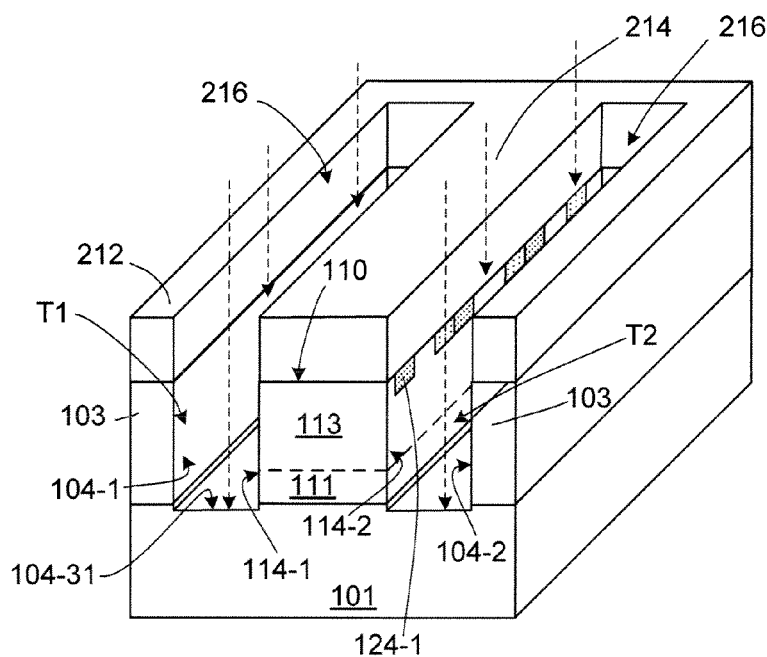

FIG. 3(C) depicts the formation of trenches T1 and T2 through openings 216 of mask 212 (i.e., over regions of substrate 101 where local isolation will be formed). In one embodiment, trenches T1 and T2 are etched using well known reactive ion etching techniques such that substantially vertical side walls 104-1, 104-2, 114-1 and 114-2 are formed on opposite sides of each trench, and extend through epitaxial layer 103 and into said silicon substrate 101, whereby upper epitaxial portion 113 is separated from epitaxial layer 103 and base epitaxial portion 111 is disposed above and between the lower ends of trenches T1 and T2. In a practical embodiment, a pattern of 4-40 μm deep and 2 μm wide trenches was fabricated using a standard deep dry etching process (Bosch process) on wafers of heavily doped P+Si (0.01-0.02 ohm-cm) having a 4 μm thick epi-layer of lightly doped Si (1-10 ohm-cm), with base epitaxial portion 111 having a nominal conductivity of 0.1-0.2 ohm-cm. According to an aspect of the present invention, the pattern of trenches acts as a light trap. The light entering the deep trench has small chances to be reflected by the HV solar array. In another embodiment, black silicon is formed on the walls of the trenches to further enhance light capture. Mask 212 is removed after the trenches are formed.

Figure 3D:
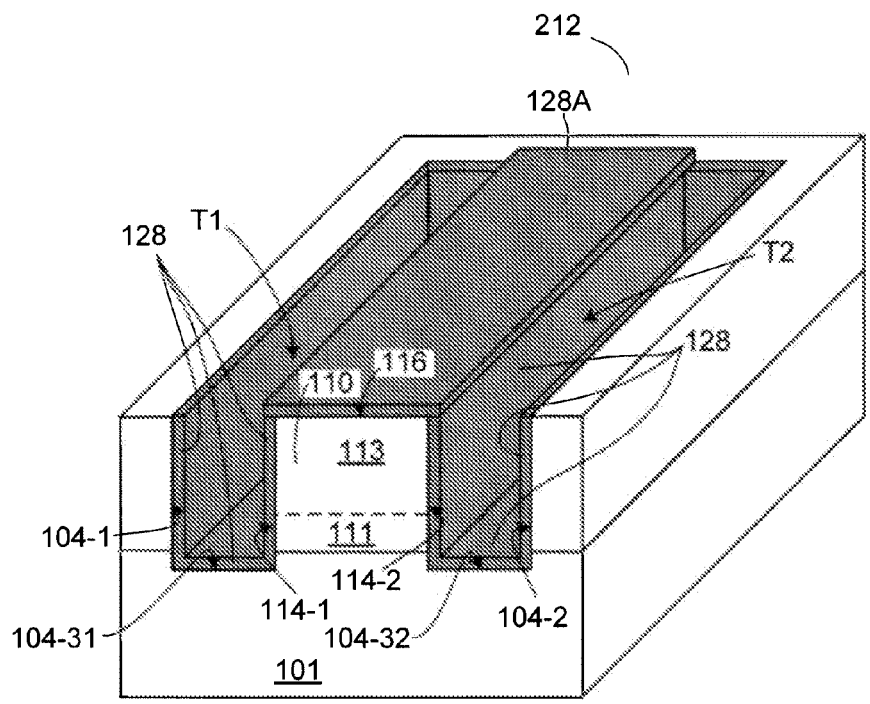
Figure 3E:
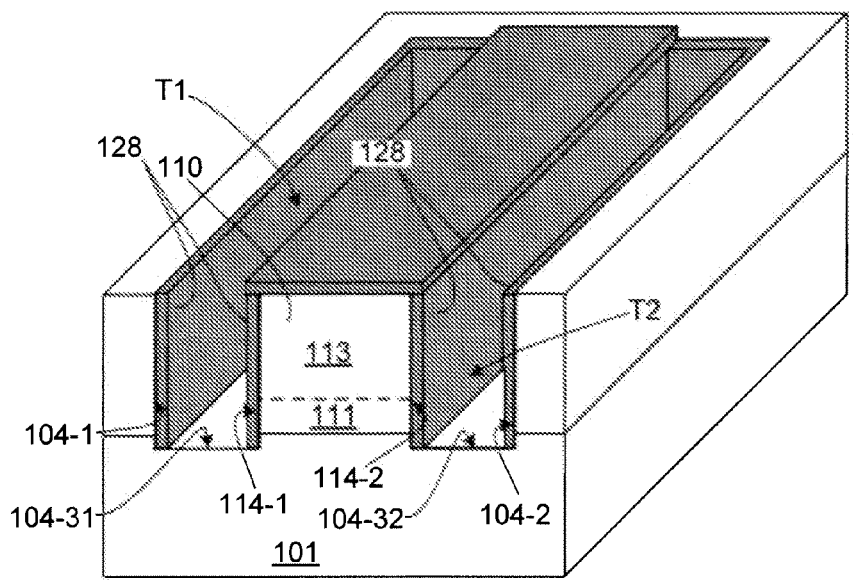

FIGS. 3(D) and 3(E) depict the subsequent formation of a protective layer 228 over island 110 and on the vertical side walls and bottom surfaces defined by trenches T1 and T2, and then the subsequent removal of protective material from the bottom surfaces. Referring to FIG. 3(D), protective layer 128 is formed, for example, by chemical vapor deposition such that portions of the protective material layer are disposed on side walls 114-1 and 114-2 of island 110, on side walls 104-1 and 104-2 of substrate 101, and on bottom surfaces 104-31 and 104-32 that extends between the facing vertical side walls in trenches T1 and T2. A portion 128A of protective layer 128 is also formed on upper surface 116 of island 110. The function of protective layer 128 is to isolate contact of the subsequent etch used to form porous silicon to P+ substrate region 101 (i.e., to prevent the PS etchant from contacting upper epitaxial portion 113 through side walls 114-1 and 114-2), and also to protect the P+ and N+ doped regions formed on island 110. The presence of protective layer 128 in trenches T1 and T2 is thus critical to the formation of the PS layer under island 110. In a presently preferred embodiment, protective layer 228 comprises a layer of silicon nitride (e.g., 5 nm-50 nm $SiO_2$ liner and then SiN; the $SiO_2$ liner allows passivating the vertical walls of the solar cell and decreases recombination) formed by chemical vapor deposition and having a thickness in the range of 100 to 300 nm, although other protective layers formed by other deposition methods may also be utilized. To further facilitate the formation of PS in substrate 101 below island 110, as indicated in FIG. 3(E), a portion of protective layer 128 disposed on bottom surfaces 104-31 and 104-32 of trenches T1 and T2 is removed by a suitable method (e.g., reactive ion etch in the case of SiN), whereby bottom surfaces 104-31 and 104-32 are exposed through protective layer 128. That is, protective material is etched off of bottom surfaces 104-31 and 104-32 to enable electrical contact between the electrochemical solution subsequently used to form porous silicon and heavily doped P+ substrate 101 through the trenches T1 and T2.

Figure 3F:
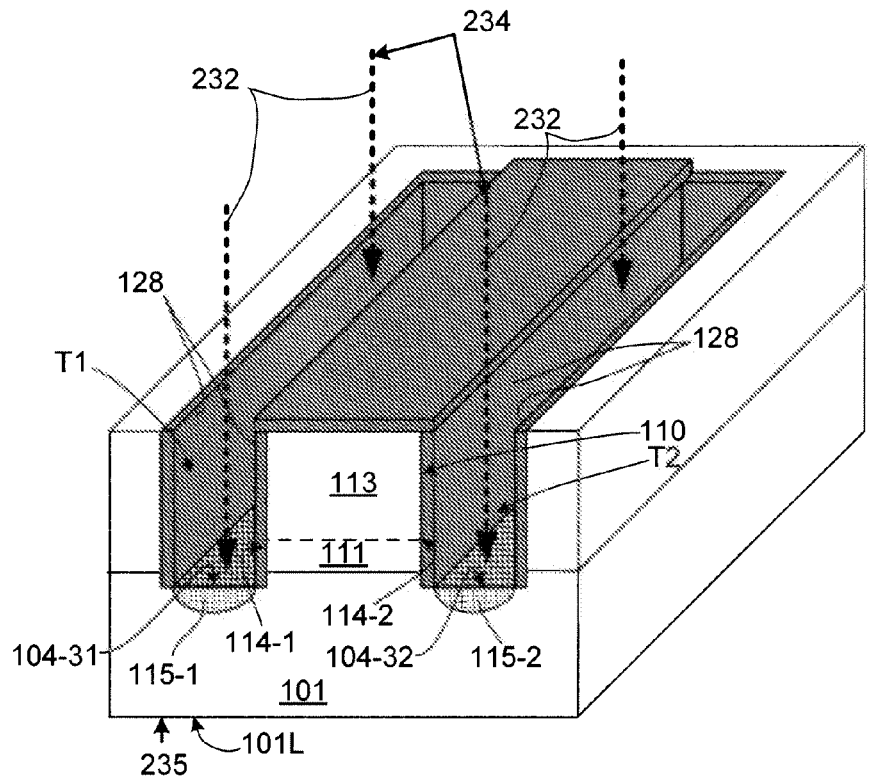
Figure 3G:
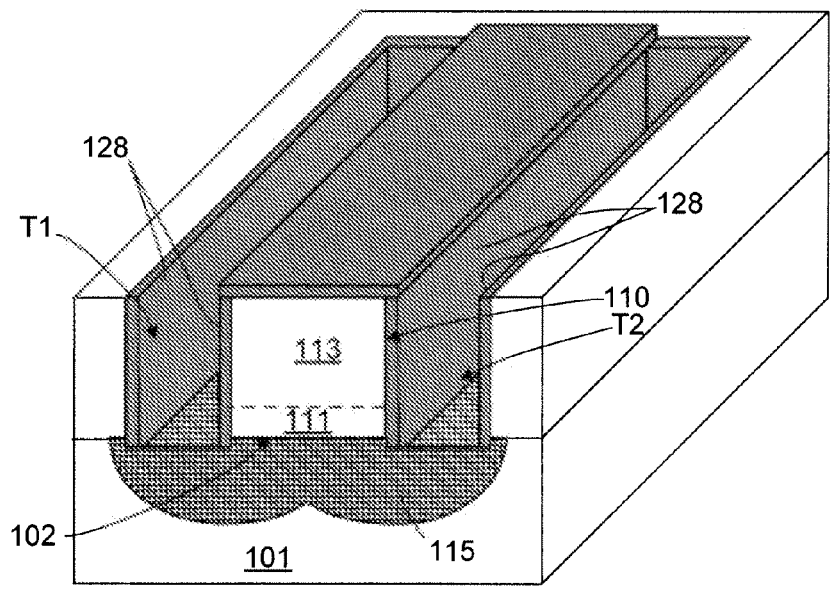

FIGS. 3(F) and 3(G) depict the subsequent formation of porous silicon (PS) under island 110 according to an exemplary embodiment of the present invention such that P+/− base epitaxial portion 111 is retained between upper epitaxial portion 113 and the porous silicon. As indicated in FIG. 3(F), porous silicon formation is initiated by introducing a suitable etchant 232 into trenches T1 and T2 such that etchant 232 acts on exposed bottom surfaces 104-31 and 104-32 (i.e., remaining protective layer 128 prevents etchant 128 from acting on side walls 114-1 and 114-2 of island 110) to initiate the growth of porous silicon regions 115-1 and 115-2 at the bottom of trenches T1 and T2, respectively. In one embodiment this process is performed using electrochemical (EC) etching by placing substrate 101 into the hydro-fluoric (HF) solution, and the process is activated by an external current source connected between a top electrode 234 (inside the HF solution) and a bottom metal electrode 235 at the backside surface 101L of Si substrate 101. The main advantage of using this EC etching process is it is relative high speed (from few nm/min up to few μm/min) and is self-limiting (meaning that the etch in the direction of P− epitaxial portion 113 stops when the etch front approaches the P− P+ interface 102, resulting in a high level of PS thickness control and good lateral uniformity. In addition, by controlling the current, one can vary the porosity and size of the pores of PS regions 115-1 and 115-2 quite easily. As indicated in FIG. 3(G), the EC etching process is continued until the two PS regions merge under island 110, thereby forming continuous PS region 115 that entirely isolates island 110 from P+ substrate 101. Further, because of the self-limiting characteristics of the EC etching process, island 110 is characterized by having P+/− base epi portion 111 disposed between P− upper epitaxial portion 113 and PS region 115, which serves to suppress electron-hole recombination at porous silicon-silicon interface.

Figure 4A:
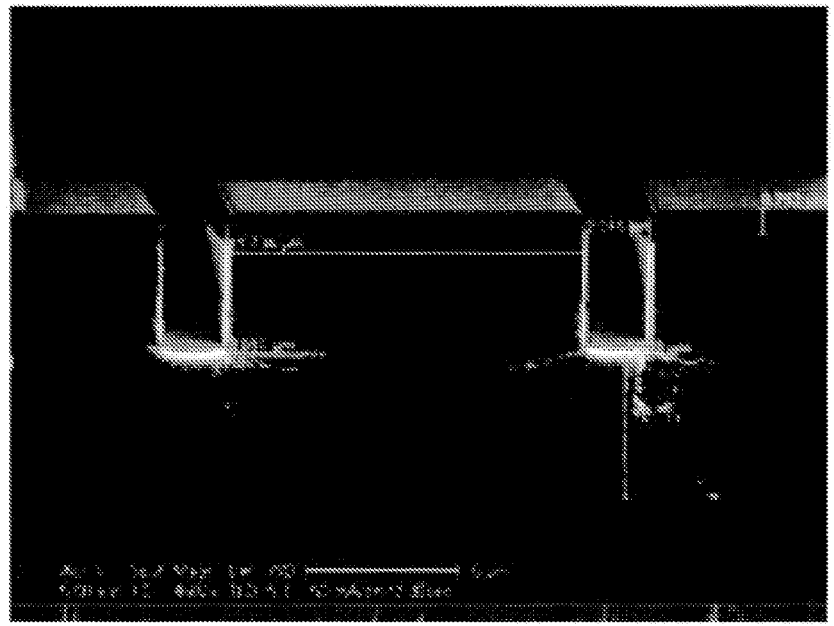
FIGS. 4(A), 4(B), 4(C), 4(D), 4(E) and 4(F) are SEM cross-section images showing buried porous silicon regions generated in accordance with the process flow according to exemplary embodiments of the present invention.
Figure 4B:
Figure 4C:
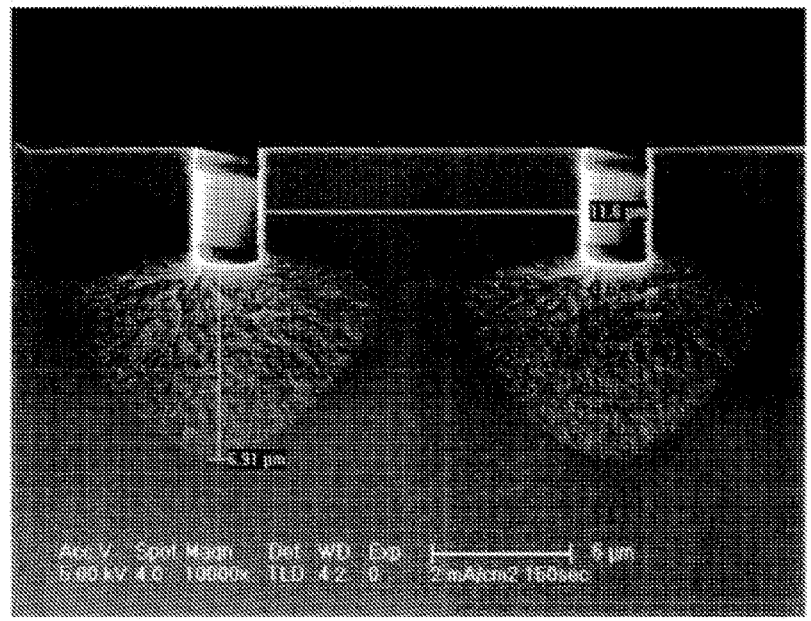
Figure 4D:
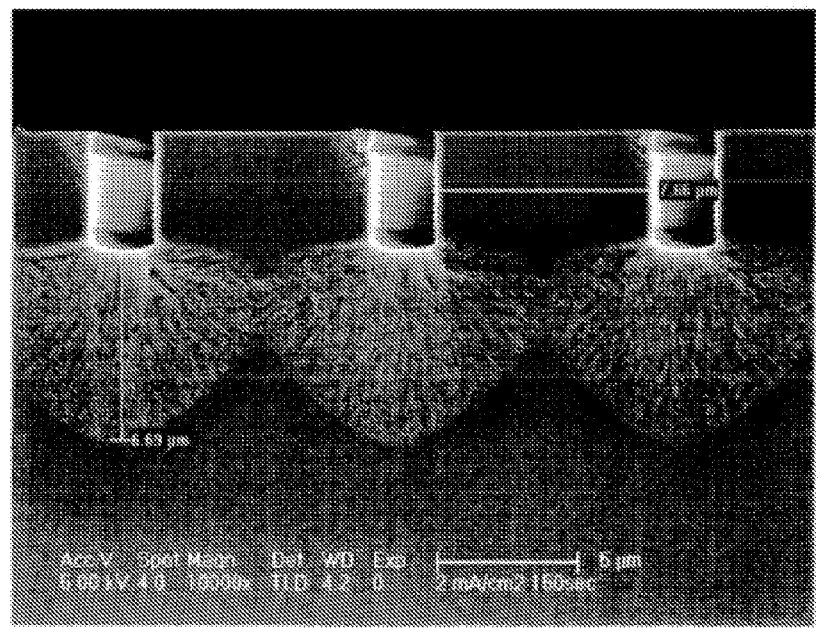

The EC process etch rate (PS formation) strongly depends on the doping of the P+ substrate. During experiments conducted by the inventors, samples were placed into a standard electrochemical cell that operated in the "galvanostatic" mode (i.e., under a constant current). The process lasted for typical times of about 50-100 seconds. The results of these experiments showed PS having been selectively created at the bottom of the trenches where the EC solution is in contact with the heavily doped Si substrate. FIGS. 4(A) to 4(D) show a few SEM cross-section images showing the resulting porous silicon structures formed at the bottoms of trenches. The thickness of the epitaxial P− layer in the structures of these figures is 4 μm. FIGS. 4(A) and 4(B) show the results of EC etching at a current density of 50 mA/cm$^2$ after a 30 second etch, and FIGS. 4(C) and 4(D) shows similar structures using a EC current density of 2 mA/cm$^2$ and etching time of 150 s. As can clearly be seen in FIGS. 4(A) and 4(B), a 'mushroom-like' PS film is created at the bottom of the trenches indicating that most of the EC current flows towards the heavily doped (and low-resistivity) substrate rather than towards the upper lightly doped epi-layer. The smaller the EC current density, the less etching of the epi-layer and less damage to the sidewalls and the top Si surfaces occurs. In FIGS. 4(A) and 4(C), the distance between the trenches is 12 μm so that the etching time is not long enough to generate a connected network of mushroom, while in FIGS. 4(B) and 4(D) the distance between the trenches is 5 μm and the mushrooms merge, creating a complete isolation between the top epi-layers and the substrate.

In another embodiment the surface of trenches was converted into PS by a special etch before SiN deposition and passivated by oxidation or deposition of ALD (atomic layer deposited) alumina (see, e.g., Extremely low surface recombination velocities in black silicon passivated by atomic layer deposition Martin Otto, Matthias Kroll, Thomas Käsebier, Roland Salzer, Andreas Tünnermann et al., Applied Physics Letters, 100, 191603 (2012)). The formation of black silicon is believed to enhance light absorption inside the islands, providing a further advantage to photovoltaic devices formed in accordance with the present invention. In addition, as indicated in FIGS. 3 (H-I) and 4 (A-D) the mushroom-like, buried layer of PS acts as random scatterers also to create a "black silicon" effect, i.e., increase the light absorption in the films, mainly due to the large refractive index difference between the PS films and the epi-silicon above.

According to an alternative embodiment, the EC etching process is modified to generate electrochemical oxidation in order to increase the resistivity of the PS region. Forming porous silicon without special further oxidation facilitates effective electrical isolation that is sufficient for operating solar cell arrays (i.e., $10^7$-$10^8$ Ohm for an isolated 100 μm long and 12 μm wide silicon island with respect to the P+ substrate). During practical testing, subsequent mild electrochemical oxidation increased the resistance of the PS to $10^{18}$-$10^{11}$ Ohm.

Figure 4E:
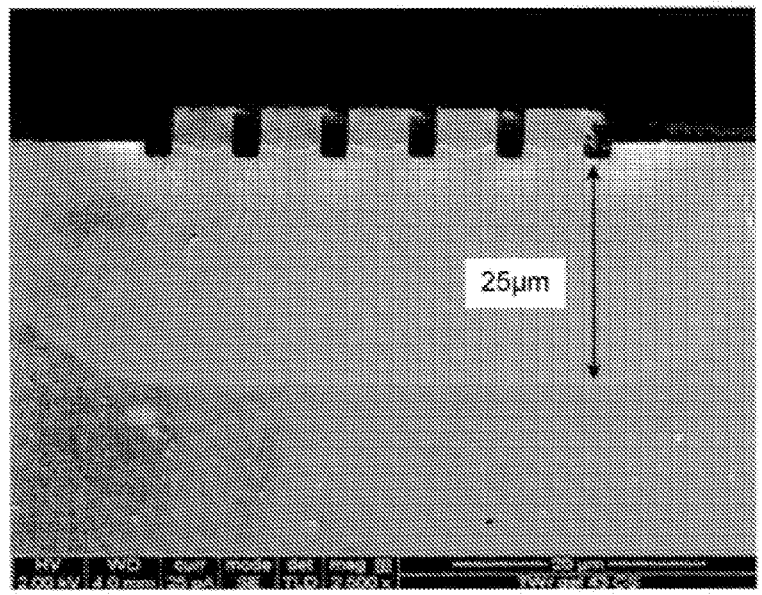
Figure 4F:
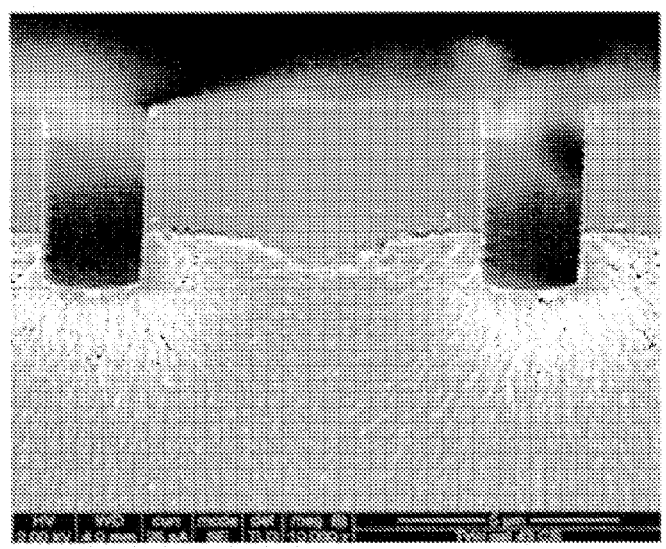

According to another alternative embodiment, in addition to the EC process described above, similar PS formation is achieved with Galvanic Etching, where electrochemical closed circuit is also formed but no external bias applied. The galvanic etching (GE) to produce PS layers is based on the chemical oxidation-reduction reaction at the interface of the metallic back contact and using of the HF-oxidant ($H_2O_2$) solution. The reaction proceeds via generation of a hole at the metal-covered (Au or silver alloy) side after oxidation of the metal while the just generated hole diffuses to the other side of the silicon wafer to react with HF and start the silicon etching process. An advantage of the GE method is its parallel processing nature, enabling the production of many samples simultaneously. A demonstration of the GE process is shown in FIGS. 4(E) and 4(F).

Figure 3H:
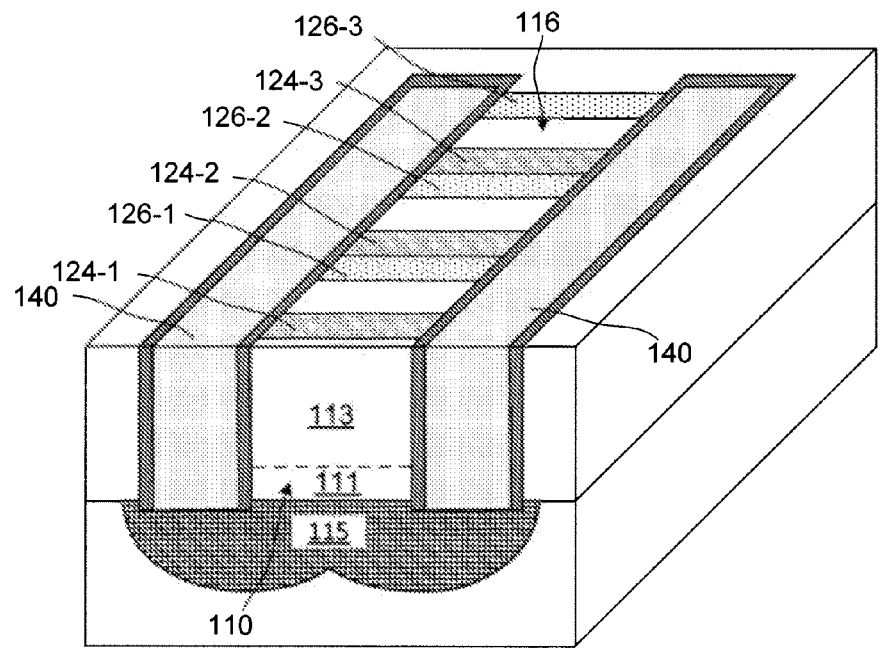

FIG. 3(H) shows island 110 after filling of the trenches with a dielectric 140 (HD plasma CVD), followed by a chemical mechanical polishing (CMP) step to expose SiN over P+ doped regions 124-1 to 124-3 and N+ doped regions 126-1 to 126-3 on upper surface 116 of epitaxial portion 113, followed by removal of the protective layer over island 110. In one embodiment, the CMP process stops at the nitride layer disposed on surface 116, and when processing continues with the formation of interconnects, the remaining SiN layer over island 110 is removed by wet etch locally through a mask. Annealing is then performed (e.g., 6-10 hours at 1000-1100° C. for trenches having a depth of 4 μm) to cause the N+ and P+ doped regions to diffuse to the surface of the PS layer.

Figure 3I:
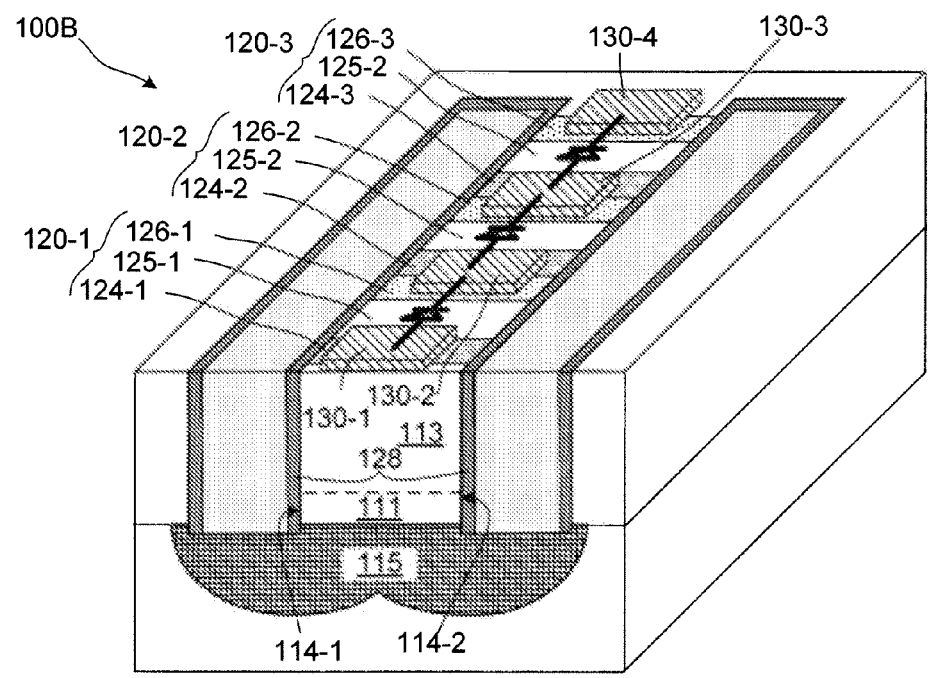

FIG. 3(I) shows a substantially completed photovoltaic device 100B in accordance with an embodiment of the present invention. Photovoltaic device 100B differs from device 100 (FIG. 1) in that device 100B includes retained portions of protective layer 128 (e.g., silicon nitride) disposed on side walls 114-1 and 114-2 of island 110. Such protective layer portions are a byproduct of the process described above and improve the performance of photovoltaic device 100B by passivating the walls thus substantially decreasing surface recombination. As mentioned above, the retained protective layers may include a portion of passivated black silicon to further improve light absorption in the trenches.

Photovoltaic device 100B also differs from device 100 (FIG. 1) in that device 100B includes a series of photosensitive diodes 120-1 to 120-3 that are connected in series along island 110 by electrically conductive structures 130-1 to 130-4. Specifically, structures 130-1 and 130-4 are disposed on P+ doped region 124-1 and 126-3, respectively to provide terminals of the device formed by diodes 120-1 to 120-3. To decrease series resistance, structures 130-2 and 130-3 are respectively connected across a (first) P/N junction formed by N+ region 126-1 and P+ region 124-2 (i.e., between diodes 120-1 and 120-2), and a (second) P/N junction formed by N+ region 126-2 and P+ region 124-3 (i.e., between diodes 120-2 and 120-3). Electrically conductive structures 130-2 and 130-3 are preferably metal film structures that are elongated in the lateral direction and have just enough length in the longitudinal direction to operably contact a portion of each associated doped region such that electrically conductive structure 130-2 forms a low resistance electrically conductive path between lateral light-sensitive diodes 120-1 and 120-2, and electrically conductive structure 130-3 forms a low resistance electrically conductive path between lateral light-sensitive diodes 120-2 and 120-3. In one embodiment, structures 130-1 and 130-4 are formed by salicide-butted contact structures or a conductive paste. In other embodiments, an aluminum film, a titanium film, a titanium-nitride stack, gold, and tungsten are used.

Figure 5:
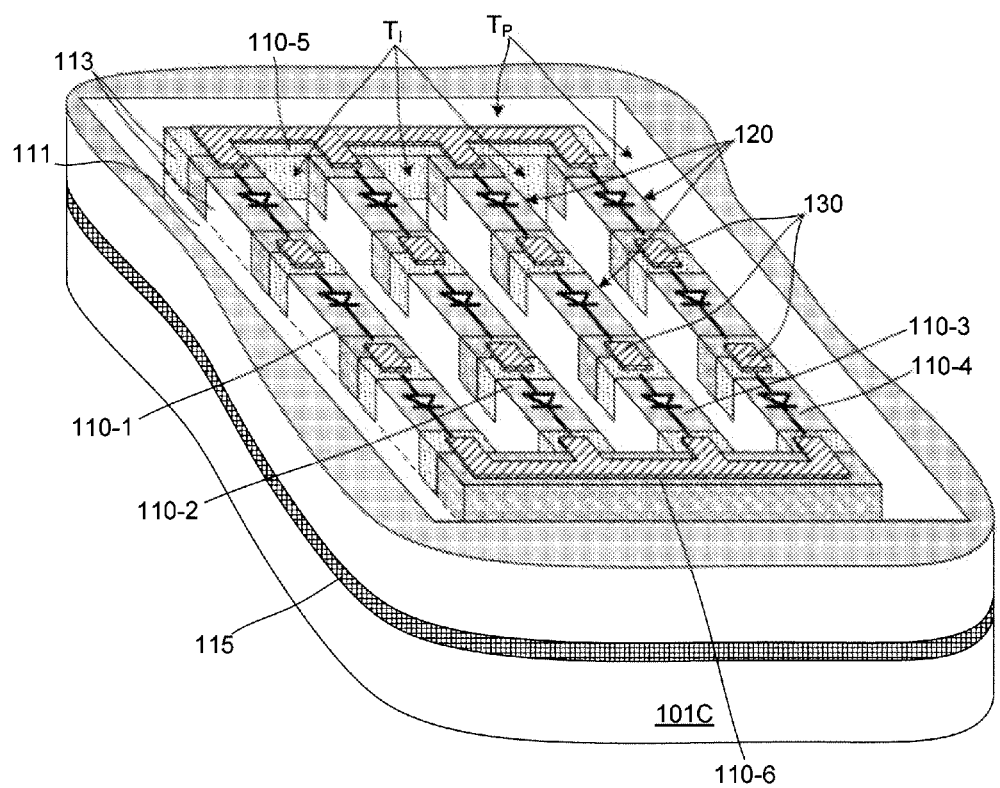
FIG. 5 is a top front perspective view showing a photovoltaic device according to another embodiment of the present invention.

FIG. 5 shows a simplified high voltage (HV) solar array (photovoltaic device) 100C formed on a host substrate 1010 according to another embodiment of the present invention. Array 100C includes twelve photo-sensitive diodes 120 disposed on four parallel elongated islands 110-1 to 110-4 that are separated by intervening elongated trenches $T_1$. Each island 110-1 to 110-4 includes three photodiodes 120 formed in the manner described above with reference to FIG. 3(I), and conductive structures 130 are disposed on the islands and connect diodes 120 in series (along each island) with the four island connected in parallel in the manner described above with reference to FIG. 3(I). According to an aspect of the invention, silicon islands 110-1 to 110-4 are integrally connected by silicon end island portions 110-5 and 110-6 (having N+ and P+ doping levels, respectively), and a peripheral trench Tp surrounds all of islands 110-1 to 110-4 and end island portions 110-5 and 110-6, thus isolating battery 100C laterally from a remainder of host substrate 101C. End island portions 110-5 and 110-6 are formed during the same process as that described above, and therefore all of islands 110-1 to 110-4 and end island portions 110-5 and 110-6 comprise a P+/− base epi portion 111 disposed between a porous silicon layer 115 and a P− upper epitaxial portion 113 in the manner described above.

Figure 6:
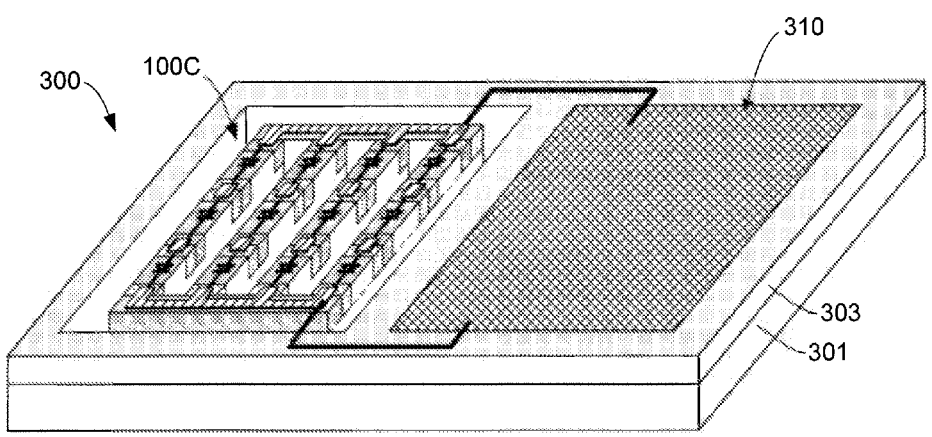
FIG. 6 is a top side perspective view showing a simplified CMOS IC device including the photovoltaic device as an embedded power source according to another specific embodiment of the present invention.

Array 100C provides an advantage over conventional photovoltaic devices in that the associated fabrication processes needed to produce the various photovoltaic device structures of array 100C can be easily integrated into standard process flows (e.g., established CMOS process flows, power management (PV) CMOS process flows, and microelectromechanical system (MEMS) process flows) without requiring any (or requiring very few) additional masks. Thus, the novel structural arrangement of array 100C is easily integrated into standard process flows using only slightly modified) process steps. By forming photovoltaic devices using existing (or only slightly modified) process flows, the present invention facilitates the use of photovoltaic device 100C to form low-cost embedded photoelectric arrays on IC devices formed by these standard process technologies. For example, referring briefly to FIG. 6, a simplified CMOS IC 300 is shown that includes both photovoltaic device 100C (described above) and a generic CMOS circuit 310 (e.g., a PM, MEMS, RFID or other mixed signal/RFCMOS device) that are entirely formed on a monocrystalline silicon substrate 301 using a standard CMOS process flow that is modified as described above to facilitate trench and PS formation. In this example, photovoltaic device 100C is connected as a supply power to CMOS circuit 310 by way of metal lines formed in accordance with the techniques described herein.

Figure 7A:
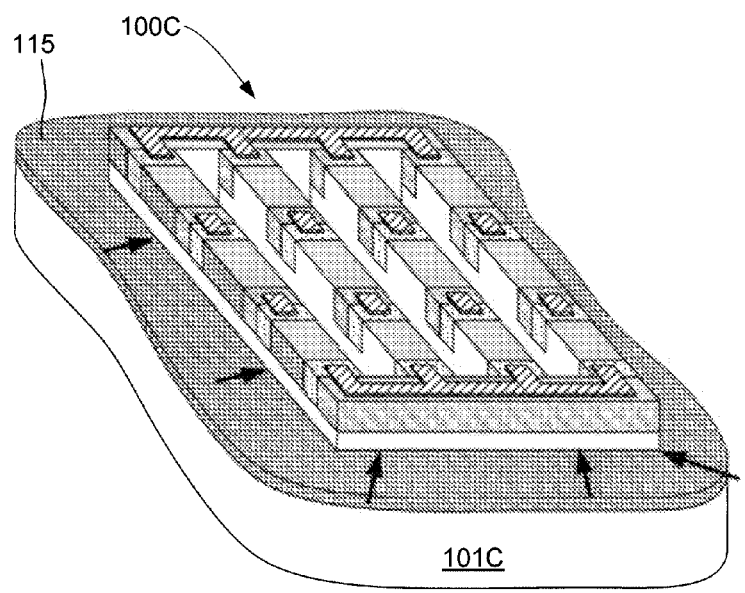
FIGS. 7(A), 7(B), 7(C) and 7(D) are top front perspective views showing a method for producing a detached a photovoltaic device according to another specific embodiment of the present invention.
Figure 7B:
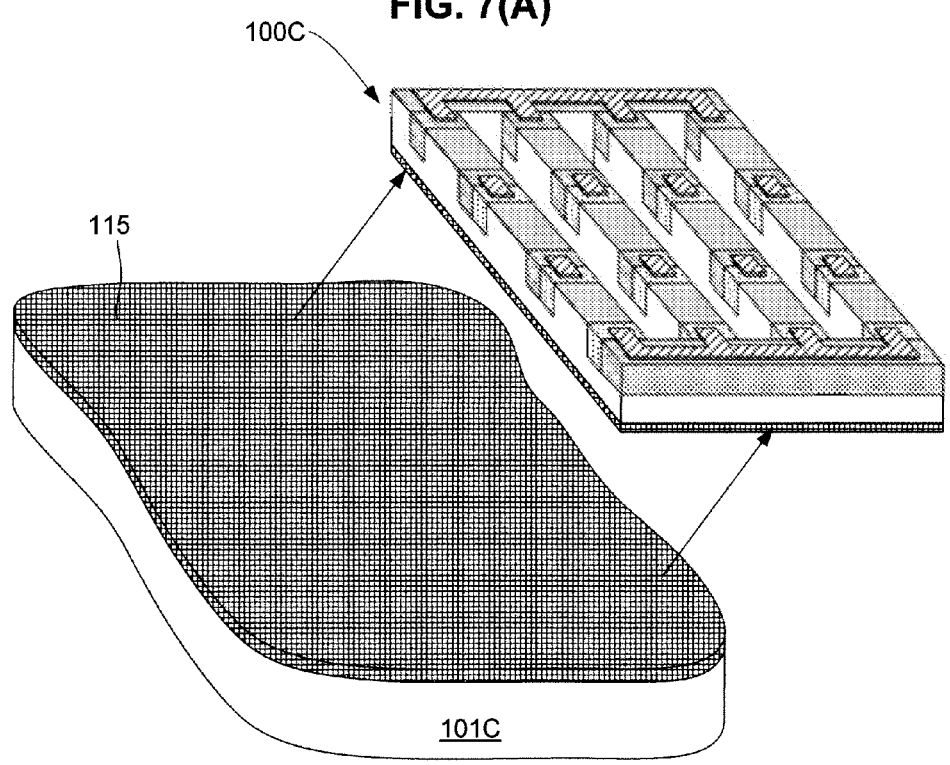
Figure 7C:
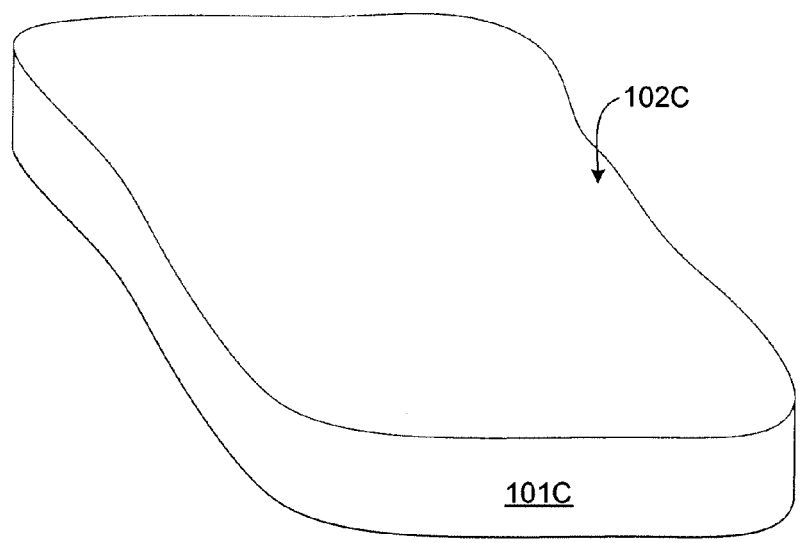
Figure 7D:
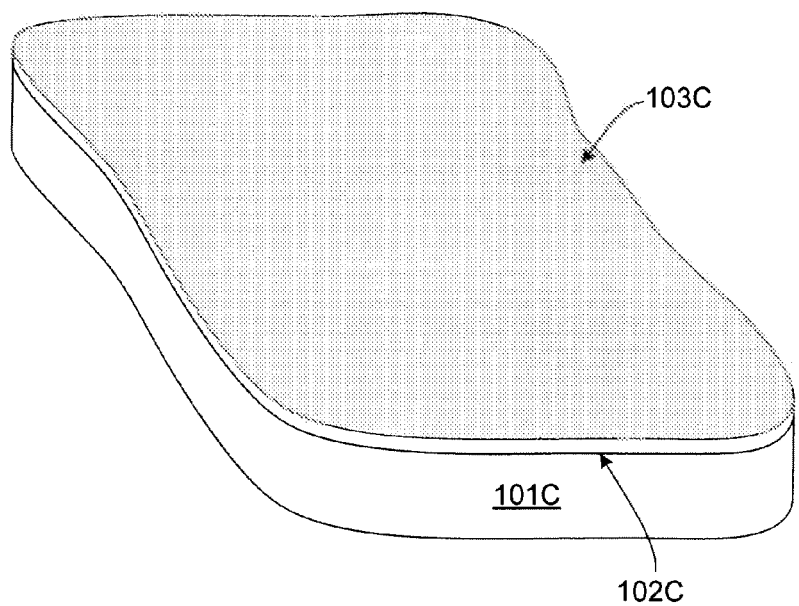
Figure 8:
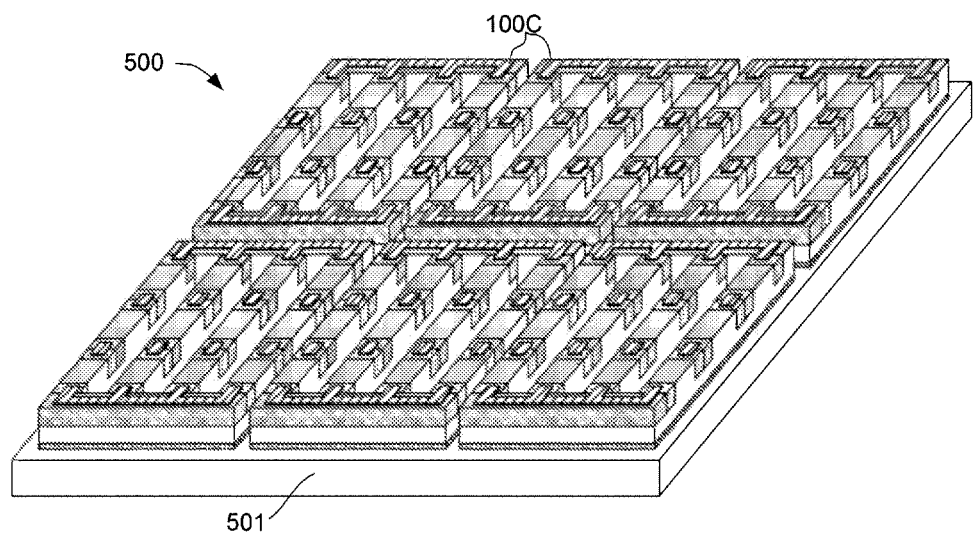
FIG. 8 is a top front perspective view showing a simplified solar panel formed by detached photovoltaic devices produced in accordance with the method of FIGS. 6(A) to 6(D) according to another specific embodiment of the present invention.

According to another alternative embodiment of the present invention described with reference to FIGS. 7(A) to 7(D), the photovoltaic devices of the present invention are separated from their base substrate and mounted onto low-cost substrates (e.g., glass or other types of isolators) to produce, for example, low-cost, high voltage solar arrays for medium-level (i.e., from several to tens of suns) solar energy concentrators. As indicated in FIGS. 7(A) and 7(B), the presence of porous silicon layer 115 facilitates separating ("lifting") array 100C from substrate 1010 after it is completed by etching through porous silicon layer 115 such that array 100C becomes separated from substrate 1010. As indicated in the lower portion of FIG. 7(B), by starting with a relatively thick layer of substrate material, a significant portion of substrate 1010 remains after array 100C is removed, with the newly-exposed "upper" surface comprising porous silicon 115. Referring to FIGS. 7(C) and 7(D), substrate 101C is prepared for further processing by performing a surface polishing process (e.g., CMP) to generate a planar surface 102C, and then a new P− epitaxial layer 1030 is formed on surface 102C, thereby preparing substrate 101C for processing in the manner described above to generate a new array 100C. Only a thickness of approximately 10 μm to 20 μm is removed from P+ substrate 101C during the CMP procedure preceding P− layer growth, thereby facilitating the use of a single substrate 101C to make multiple HV solar cell arrays 100C. Further, as indicated in FIG. 8, a low cost HV solar array 500 is fabricated by mounting multiple separated arrays 100C on a low cost (e.g., glass) substrate 501.

Figure 9:
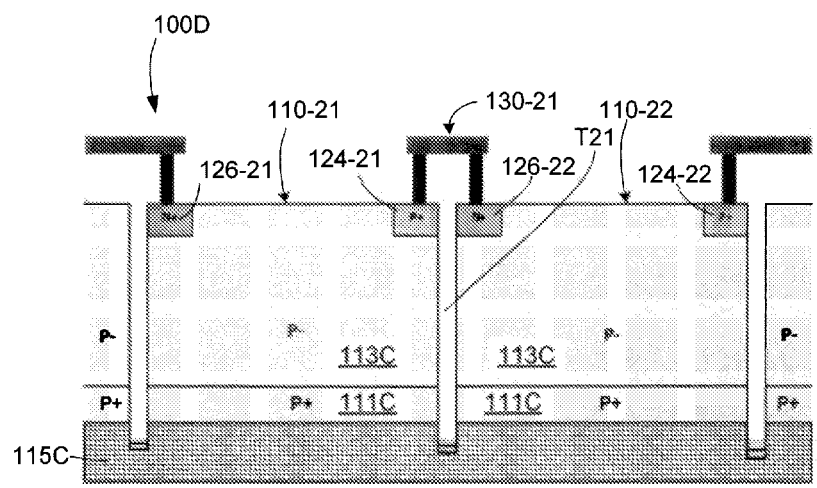
FIG. 9 is cross-sectional side view showing a photovoltaic devices produced in accordance with another specific embodiment of the present invention.

FIG. 9 is cross-sectional side view showing a photovoltaic device 100D produced in accordance with yet another specific embodiment of the present invention. Like previous embodiments, device 100D includes multiple silicon islands separated by intervening trenches (e.g., islands 110-21 and 110-22 are separated by trench T21), and each island includes both a P− upper epitaxial portion 113C and a P+/− base epi portion 111C formed on a porous silicon layer 1150. In addition, each island 110-21 and 110-22 includes P+ and N+ regions separated by intrinsic P− material (e.g., island 110-21 includes P+ region 124-21 and N+ region 126-21, and island 110-22 includes P+ region 124-22 and N+ region 126-22). However, device 100D differs from previous embodiments in that one photo-sensitive diode is formed on each island, and the diodes are connected in series by conductive structures extending over the intervening trench (e.g., P+ region 124-21 is connected to N region 126-22 by intervening structure 130-21). The benefit of separating the series-connected diodes on separate islands is that P+ and N+ regions can be more shallow than in previous embodiments thus not needing high thermal budgets to drive-in the N+ and P+ implants through the whole thickness of the epitaxial layer. Light conversion efficiency may be increased by way of the "black silicon" produced on the side walls of the trenches (forming black silicon before SIN and passivating the surfaces). Note that device 110D also depicts the use of standardized metallization to provide conductive structure 130-21 (i.e., using vias and metal lines formed in M1 metallization), which can be used to further reduce manufacturing costs.

Although the present invention has been described with respect to certain specific embodiments, it will be clear to those skilled in the art that the inventive features of the present invention are applicable to other embodiments as well, all of which are intended to fall within the scope of the present invention. For example, although the process is described above with reference to the formation of photovoltaic devices on a P-type substrate, the methods descried above may be modified using techniques known in the art to produce similar devices on N-type substrates. Further, the Si epitaxial layer described above may be implemented using another semiconductor such as Ge, SiGe and GaN.

The invention claimed is:

1. A photovoltaic device comprising:
   an island including a base epitaxial portion having a first doping level and an upper epitaxial portion disposed on the base epitaxial portion and having a second doping level that is lower than said first doping level, said island being disposed between first and second side walls defined by one or more trench regions that respectively extend from said base epitaxial portion to an upper surface of said upper epitaxial portion;
   a light-sensitive diode disposed on said island, said light-sensitive diode including a first P+ doped region formed by a P+ dopant diffused into said upper epitaxial portion, an intrinsic region of said upper epitaxial portion, and a first N+ doped region formed by an N+ dopant diffused into said upper epitaxial portion, said intrinsic region being disposed between said first P+ doped region and said first N+ doped region;
   wherein the base epitaxial portion of said island is entirely disposed on a porous silicon region.

2. The photovoltaic device of claim 1, wherein the island comprises an epitaxial silicon layer integrally disposed on a silicon substrate having a third doping level, and wherein said base epitaxial portion is electrically isolated from said silicon substrate by said porous silicon region.

3. The photovoltaic device of claim 2, wherein said base epitaxial portion comprises a first P-type dopant concentration forming said first doping level, wherein said upper epitaxial portion comprises a second P-type dopant concentration forming said second doping level, wherein said silicon substrate comprises a third P-type dopant concentration forming said third doping level, and wherein said first P-type dopant concentration is greater than said second P-type dopant concentration and lower than said third P-type dopant concentration.

4. The photovoltaic device of claim 1, further comprising a protective layer disposed on said first and second side walls of said island.

5. The photovoltaic device of claim 1, further comprising a second diode connected in series with said diode on said island, said second diode including:
   a second P+ doped region formed by said P+ dopant diffused into said upper epitaxial portion adjacent to said first N+ doped region; and
   a second N+ doped region formed by said N+ dopant diffused into said upper epitaxial portion and separated by a second intrinsic region from said second P+ doped region.

6. The photovoltaic device of claim 5,
   wherein the second P+ doped region is disposed adjacent to said first N+ doped region; and
   wherein said photovoltaic device further comprises a first electrically conductive structure connected between the first N+ doped region and the second P+ doped region.

7. The photovoltaic device of claim 6, wherein each of said first electrically conductive structures comprises one of a silicide film, an aluminum film, a titanium film, a titanium-nitride stack, gold, tungsten, a conductive paste film disposed on an upper surface of said epitaxial portion, and a N+-P+ tunnel junction with low resistance.

8. The photovoltaic device of claim 1, further comprising a dielectric material disposed in said first and second trenches.

9. The photovoltaic device of claim 1, further comprising:
   a second island disposed adjacent to said island and separated by an intervening trench;
   a second photo-sensitive diode including a second N+ doped region formed on the second island; and
   an electrically conductive structure extending between said first P+ doped region and the second N+ doped region over said intervening trench.

10. The photovoltaic device of claim 1, wherein the first and second side walls comprise black silicon.

11. A photovoltaic device comprising:
    a plurality of islands separated by intervening trenches, wherein each of said islands includes epitaxial silicon having a highly doped base epitaxial portion and a lightly doped upper epitaxial portion disposed on the base epitaxial portion;
    a plurality of photosensitive diodes formed by spaced-apart P+ and N+ doped regions disposed in the upper epitaxial portion of said plurality of islands; and
    a plurality of electrically conductive structures disposed on upper surfaces of said islands, said electrically conductive structures being operably connected to said P+ and N+ doped regions such that said plurality of photosensitive diodes are connected in series,
    wherein said plurality of islands are disposed on porous silicon such that said highly doped base epitaxial portion is disposed between said lightly doped upper epitaxial portion and said porous silicon.

12. The photovoltaic device of claim 11, wherein said plurality of islands comprise epitaxial silicon integrally disposed on a silicon substrate having a third doping level, and wherein said base epitaxial portion is electrically isolated from said silicon substrate by said porous silicon.

13. The photovoltaic device of claim 12, wherein said silicon substrate comprises a heavily doped P-type silicon having a higher doping concentration than that of said base epitaxial layer.

14. The photovoltaic device of claim 11, wherein each of said plurality of islands includes a plurality of photosensitive diodes connected in series by corresponding electrically conductive structures of said plurality of electrically conductive structures.

15. The integrated circuit of claim 11, wherein each of said plurality of electrically conductive structures comprises one of a silicide film, an aluminum film, a titanium film, a titanium-nitride stack, gold, tungsten, a conductive paste film disposed on an upper surface of said epitaxial layer, and a N+-P+ tunnel junction with low resistance.

16. The photovoltaic device of claim 11, wherein said plurality of islands are integrally connected by one or more end portions, each of said one or more silicon end portions including a highly doped base epitaxial portion and a lightly doped upper epitaxial portion disposed on the base epitaxial portion.

17. The photovoltaic device of claim 16, wherein said plurality of islands and said one or more silicon end portions are entirely surrounded by a peripheral trench.

18. The photovoltaic device of claim 11, wherein each electrically conductive structure extends between said a first said P+ doped region disposed on a first said island and a second N+ doped region disposed on an adjacent said island over said intervening trench.

19. A CMOS integrated circuit device including a CMOS circuit and an embedded photovoltaic device fabricated on a single-crystal silicon substrate and operably connected such that power generated by said photovoltaic device is supplied to said CMOS circuit, wherein the photovoltaic device comprises:

an island formed by a portion of an epitaxial silicon layer disposed on said single-crystal silicon substrate, said island including a base epitaxial portion having a first doping level and an upper epitaxial portion disposed on the base epitaxial portion and having a second doping level that is lower than said first doping level, said island being disposed between first and second side walls defined by one or more trench regions that respectively extend from said base epitaxial portion to an upper surface of said upper epitaxial portion;

a light-sensitive diode disposed on said island, said light-sensitive diode including a first P+ doped region formed by a P+ dopant diffused into said upper epitaxial portion, an intrinsic region of said upper epitaxial portion, and a first N+ doped region formed by an N+ dopant diffused into said upper epitaxial portion, said intrinsic region being disposed between said first P+ doped region and said first N+ doped region;

wherein the base epitaxial portion of said island is entirely disposed on a porous silicon region such that the island is electrically isolated from the single-crystal silicon substrate by said porous silicon region.

\* \* \* \* \*